March 27, 1951 D. M. RUGGLES 2,546,321

PIEZOELECTRIC CRYSTAL APPARATUS

Filed Feb. 12, 1949

INVENTOR
D. M. RUGGLES
BY W. J. O'Neill
ATTORNEY

Patented Mar. 27, 1951

2,546,321

UNITED STATES PATENT OFFICE 2,546,321

PIEZOELECTRIC CRYSTAL APPARATUS

David M. Ruggles, Mount Tabor, N. J., assignor to Bell Telephone Laboratories, Incorporated, New York, N. Y., a corporation of New York Application February 12, 1949, Serial No. 76,041

14 Claims. (Cl. 171—327)

Figure 1:
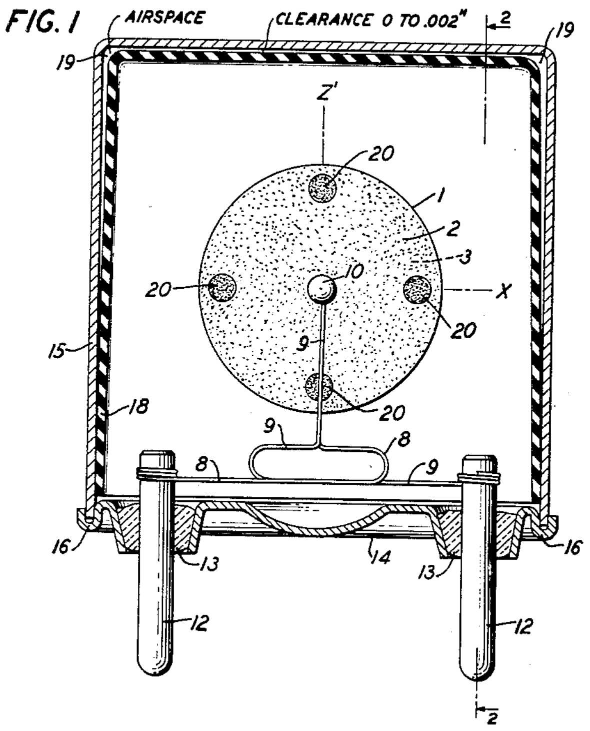

This invention relates to piezoelectric crystal apparatus and particularly to crystal shaping, mounting and assembly arrangements for quartz or other piezoelectric crystal units useful as circuit elements in oscillation generator systems, electric wave filter systems and in other electromechanical vibratory systems.

One of the objects of this invention is to provide a crystal holder arrangement suitable for preventing damage to the piezoelectric crystal unit when it is subjected to mechanical shock, jar or other externally applied mechanical vibration or disturbance.

A more specific object of this invention is to prevent chipping or fracture of the piezoelectric crystal element and twisting of the crystal support wires, resulting from mechanical shock applied to the crystal unit assembly.

Other objects of this invention are to extend upwardly to higher temperatures the permissible operating temperature range of piezoelectric crystal units, and also to increase the operating activity, to improve the stability and to provide a more rugged piezoelectric crystal unit.

Another object of this invention is to adjust to final value the desired frequency of a face mode type of piezoelectric crystal body.

Another object of this invention is to increase the frequency constant and to reduce the cost of manufacture of face mode type piezoelectric crystal elements.

These and other objects may be obtained by utilizing in combination or separately such features as a round or circular shape for the piezoelectric crystal plate, a high temperature solder for attaching the crystal mounting wires to the electroded piezoelectric crystal plate, an air-cushion type of insulating liner for the enclosing cover or container of the crystal unit assembly, and by applying small spots of metallic coating to the major face peripheral margins of the electroded crystal body for final frequency adjustment.

It is common practice to support a quartz or other piezoelectric crystal plate by means of electrically conductive flexible spring wires which may be attached adjacent their extreme innermost ends to the respective integral metallic electrodes of the crystal plate by means of metallic fusion, solder, cement, or other suitable adhesive or bonding means. In such arrangements, it is desirable that the supporting spring wire system have a low mechanical impedance and at the same time have sufficient rigidity that the complete crystal unit, when subjected to mechanical shock or other externally applied jar or vibration, may not be damaged, nor change its characteristics as an oscillator.

The supporting spring wire system for the crystal element may form a shock cushioning system which functions to reduce the effect of mechanical shock on the crystal element and also on the soldered or cemented joints or other joint fastening means that may be utilized for attaching the crystal support wires to the electroded crystal body. The bodily displacement of the crystal, due to externally applied shock, may often be of a magnitude to cause the crystal element to bump against its associated stop means which may be the enclosing container acting as a bumper, or other stop means, and the effect of such bumping action may be to chip, fracture or damage the edges or corners of the crystal plate when the usual square or rectangular shaped crystal plate is used, and also to place such an injurious torsion or twisting strain upon the soldered or cemented joints disposed between the electroded crystal plate and its associated supporting wires as to cause the adhesive joint to fail mechanically and electrically.

Accordingly, piezoelectric crystal units often are, in the course of shipment and in use, subjected to severe and frequent mechanical shocks which are transmitted through the crystal supporting spring wires to the crystal body, with the result that the periphery of the crystal may bump against the inner walls of the associated enclosing container or other bumper, and eventually chip or otherwise damage the edges of the crystal, particularly when the usual square or rectangular shaped crystal is used. Moreover, considerable strains may thereby be placed on the crystal mounting means which may be sufficient to weaken or even rupture it, particularly at the soldered or other adhesive joints disposed between the crystal support wires and the electroded crystal body. The forces on the crystal produced by such shocks are often in directions that produce a twisting action which may cause one or more of the support wires to twist off and part from the associated crystal at the adhesive joint or bond therebetween.

In accordance with one feature of this invention, the major faces of the crystal plate may be made of round or circular shape thereby having its peripheral edge free from corners. Crystal corners tend to chip and to become easily damaged when bumped against the enclosing container or other adjacent stop means. The round or curved shaped crystal periphery has been found to be comparatively free from such chipping damage when subjected to the bumping action referred to. Moreover, being free of corners, the rounded form of crystal plate does not tend to place an injurious twisting strain on the solder or other adhesive joints disposed between the crystal plate and its associated supporting wires, when the assembly is subjected to the bumping action referred to. In addition to providing a more rugged crystal unit, the round shaped crystal plate also results in giving an increased frequency constant as well as a reduction in the cost of manufacture.

In order to further reduce chipping damage to the edges of the crystal body, the enclosing cover, which may be a metal container, may be provided with a suitable air-cushion type of shock-absorbing and insulating liner, such as a molded one-piece "nylon" liner, serving as a relatively soft or pliant stop means or bumper for the crystal plate during the bumping action caused by shock, as well as serving as an electrical insulator means disposed between the enclosing metal cover and parts of the conductive wire mount system disposed within the metal cover. Also, a one-piece liner, being free from butt joints therein, eliminates a possible source of trouble from detached free ends due to warpage that would or may after a time, protrude and thus interfere with the operation of the crystal. Also, the "nylon" or other similar plastic type liner, does not give off fumes that may after a time get onto the associated crystal plate and eventually lower the frequency thereof.

Also, a high temperature eutectic type of solder may be utilized to form the solder joints between the crystal support wires and the associated crystal electrodes. Such a solder may be utilized to obtain a strong solder joint, and also to provide the crystal unit with a higher activity level as well as a better frequency stability particularly when used at operating temperatures of about 90° C. or higher. The solder for this purpose may be a tin-silver-cadmium eutectic solder alloy composed of about 95.5 per cent tin, about 3.5 per cent silver and about 1.0 per cent cadmium.

The crystal element may be adjusted to frequency by lowering the frequency of the crystal by evaporating gold in vacuum onto the crystal surfaces. In this method, a base coat of gold of about 2.7 milligrams per square inch may be first applied to the opposite major faces of the quartz or other crystal plate by the known evaporation in vacuum process. The base coatings of evaporated gold referred to permit the crystal plate to be piezoelectrically oscillated at its operating frequency while simultaneously applying the subsequent coatings of evaporated gold for frequency adjustment purposes. For the initial or rough frequency adjustment, the additional gold may be evaporated onto the entire major faces of the piezoelectric crystal plate on top of the base gold coatings referred to, and for the final frequency adjustment, additional spots of gold may be evaporated in vacuum at selected spots on one or both the major faces of the crystal plate adjacent the margins or periphery thereof. The spots of evaporated gold referred to may be in the form of four small circular areas having a diameter of about one-fifth of the crystal major face dimension and placed in balanced loading arrangement symmetrically around and adjacent the four corners of the crystal plate in the case of a square or rectangular faced crystal, or placed symmetrically around the peripheral margin in the case of a round or circular faced crystal plate. Suitable separate masks may be used with the same evaporator fixture to place the evaporated gold coatings at the desired positions on the crystal plate and to keep to a minimum the heating of the crystal plate and its associated soldered wire supports. Sufficient gold may be added to get the desired frequency change in the metallized crystal plate. The ratio of the density to the modulus of elasticity of gold being greater than that for quartz, a lowering in frequency may be easily obtained by depositing gold on the crystal plate.

While the invention is described herein with particular reference to a quartz crystal plate, it will be understood that the invention may be applied to other forms of piezoelectric elements.

Figure 2:
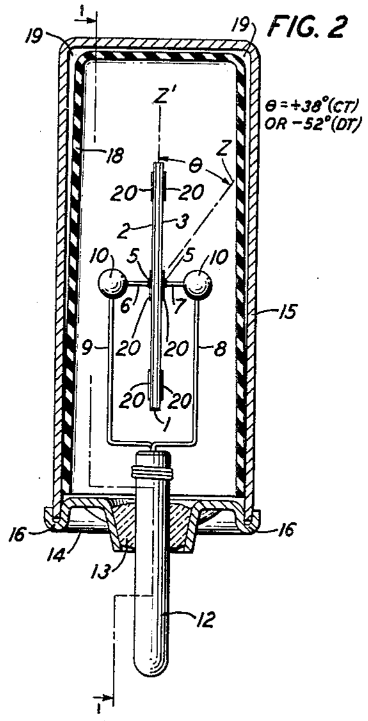
Figure 3:
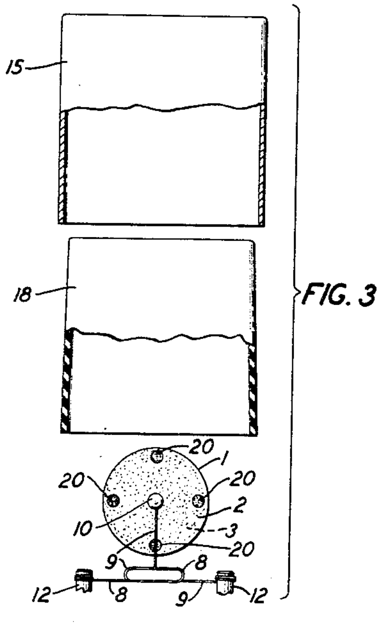

For a clearer understanding of the nature of this invention and the additional advantages, features and objects thereof, reference is made to the following description taken in connection with the accompanying drawing, in which like reference characters represent like or similar parts and in which:

Figs. 1 and 2 are respectively enlarged front and side views in section, illustrating a wire mounted piezoelectric crystal unit assembly constructed in accordance with this invention, Fig. 1 being a view taken on the line 1—1 of Fig. 2, and Fig. 2 being a view taken on the line 2—2 of Fig. 1; and Fig. 3 is an exploded view of the crystal unit assembly shown in Fig. 1.

Referring to the drawing, Figs. 1 and 2 are enlarged front and side views in section illustrating a piezoelectric crystal unit comprising a quartz piezoelectric crystal body 1 in the form of a thin plate having a pair of conductive electrodes 2 and 3 formed integral with the two opposite major surfaces of the crystal plate 1, and a pair of conductive flexible spring support wires 6 and 7 secured at their respective inner ends to the two metallic electrode coatings 2 and 3 of the crystal plate 1 by means of suitable conductive solder joints 5. The solder joints 5 may be for example in the form of small solder cones or alternatively in the form of flat-headed wire ends soldered to the crystal electrodes 2 and 3, as illustrated in Figs. 5 and 6 respectively of United States Patent 2,371,613 issued March 20, 1945 to I. E. Fair. The two horizontal flexible spring wires 6 and 7 may be carried at their outer ends by two separate upright conductive flexible spring wires 8 and 9, the ends of the wires 6, 7, 8 and 9 being firmly embedded in two conductive small solder balls 10. The solder balls 10 may function as nodal reflectors or terminating impedances, as disclosed in United States patents to I. E. Fair No. 2,371,613 dated March 20, 1945, and No. 2,441,139 dated May 11, 1948. The upright spring wires 8 and 9 may extend downwardly from the respective solder balls 10 disposed at each side of the crystal element 1, and then in the region below the crystal plate 1 may extend across to the opposite side of the crystal plate 1 and there be provided with suitably shaped bends therein as disclosed in Fair Patent 2,441,139 dated May 11, 1948. The lower ends of the flexible wires 8 and 9 may be carried by two conductive fixed terminal pins 12 extending through sealed insulated openings 13 provided in a supporting metal base 14 enclosed by any suitable metal or other container cover 15. The base 14 on its upper side may be provided with a moat or groove 16 extending around the entire peripheral margin of the upper surface of the base 14, and the lower edge of the cover 15, resting in the moat or groove 16 referred to, may be secured thereto by means of a ring of solder in order to provide a good hermetic seal between the cover 15 and the base 14. The terminal pins 12 may be sealed in glass beads 13 provided in the base 14. A vent hole (not shown) may be provided in the side of the cover 15 in order to evacuate or fill the sealed enclosing casing 14 and 15 with dry air or other suitable gas, after which the vent hole may be sealed up by solder.

While the enclosing container 14 and 15 has been described and illustrated with reference to a particular arrangement, it will be understood that other forms of enclosing container arrangements may be utilized. Also, while the invention has been described with reference to a wire support system of the type described in I. E. Fair Patent 2,441,139 dated May 11, 1948, it will be understood that other forms of flexible support systems may be utilized such as those disclosed in Fair Patent 2,371,613 dated March 20, 1945, Brooks Patent 2,388,596 dated November 6, 1945, and Ziegler Patent 2,275,122 dated March 3, 1942, for example.

The crystal plate 1 may be a face mode type of crystal plate, such as a quartz crystal plate 1 operating in face mode vibrations of the shear type at a frequency determined mainly by the major face dimensions thereof and having its node or region of minimum motion at or near the centers 5 of the major faces of the crystal plate 1. Such face shear mode quartz crystal plates 1 may have a low or nearly zero temperature coefficient of frequency when cut to have their major faces disposed parallel or nearly parallel with respect to an X or electric axis of the quartz, and inclined at an angle of either about +38(CT) or −52(DT) degrees with respect to the optic or Z axis of the crystal quartz, as disclosed for example in United States Patent 2,268,365 issued December 30, 1941 to G. W. Willard, and also in United States patents to I. E. Fair, No. 2,371,613 issued March 20, 1945 and No. 2,441,139 issued May 11, 1948.

The thickness or thin dimension of the crystal plate 1 may be adjusted to a suitable value relative to the larger major face diameter thereof in order to place undesired resonances therein in regions that do not conflict or interfere with the desired main resonance which in the example illustrated is a face shear mode of motion controlled mainly by the dimensional value of the major face diameter of the crystal plate 1. The values most suitable for such predimensioning of the thickness dimension relative to the major face diameter of the crystal plate 1, may be determined by trial and experiment.

The crystal electrodes 2 and 3 may comprise coatings of gold, silver or other suitable metallic material formed integral with each of the opposite major faces of the crystal plate 1. At the nodal regions 5, which in the example illustrated are located adjacent the centers of each of the opposite major faces of the crystal plate 1, small spots of baked silver or other suitable metallic paste may form a thickened part of the electrode coatings 2 and 3, and may be firmly baked directly onto the faces of the crystal plate 1 in a known manner, and thereafter the inner ends of the spring support wires 6 and 7 may be soldered to such baked metallic paste spots by means of conductive solder forming the adhesive joints 5. The conductive flexible spring wires 6 and 7, and also the wires 8 and 9, function not only to resiliently support the electroded crystal plate 1 but also to establish the individual electrical connections extending between the separate pin terminals 12 and the respective electrodes 2 and 3 disposed on the opposite major faces of the crystal plate 1.

The wire support system for the crystal plate 1 forms a part of the vibrating system and may, together with the solder joints 5 which are utilized to bond the support wires 6 and 7 to the associated crystal electrodes 2 and 3, adversely affect the system vibrational frequency and render it sluggish in vibration. A part of such sluggishness in vibration may be due to the composition and positioning of the solder joints 5 since each of the solder joints 5 occupies a moving area on the crystal electrodes 2 and 3 and the motion is transmitted through the solder joints 5 to the support wires 6 and 7.

The effect of the solder masses 5 on the activity of the vibrating system may be minimized by making them as small as possible and by placing them as near as possible to the node or region of minimum motion of the crystal body, thereby to minimize absorption of energy in the solder joint 5. Also, the effect of the solder joints 5 on the activity and Q of the crystal body 1 may be lessened by using a suitable hard, eutectic, high temperature melting point solder joint 5 which gives a better Q at the higher operating temperature limits of 90° C. or more, thus reducing the effect of decreasing crystal activity at such higher temperature operation. The Q, which is the conventional designation for the ratio of the reactance to the resistance, is rather low for a soft type of solder joint 5 and decreases still further with an increase in the operating temperature. The effect of the solder joints 5 on the equivalent circuit for the crystal vibrating system is to raise the damping resistance and this resistance may increase with an increase in the ambient operating temperature. Accordingly, the amount of solder permissible in the solder joints 5 is determined by the maximum temperature at which the crystal unit is to be operated and the minimum Q allowable for the crystal unit.

A good high temperature solder joint 5 may be obtained by utilizing a solder alloy comprising about 95.5 per cent tin, about 3.5 per cent silver, and about 1.0 per cent cadmium. This solder has a high resistance to creep under the high stresses often encountered in crystal support wires when subjected to shock and accordingly resists well the pulling out of the ends of the support wires 6 and 7 from the solder joints 5. The melting point of this solder being about 220° C. requires a soldering temperature, such as a hot air stream soldering temperature of approximately 260° C. at the solder joints 5 for the wire attaching operation. The soldering flux used may consist of about 50 per cent rosin and 50 per cent Butyl Carbitol, or other suitable rosin or acid flux.

For purposes of good mechanical strength and good electrical conductivity, a good joint 5 is needed between the crystal supporting lead wires 6 and 7 and their respective crystal coatings 2 and 3. A crack in the solder connections 5 will introduce a mechanical loss into the piezoelectric vibrating system and thereby reduce the vibratory activity of the system. In some cases, the loss so introduced by a crack in the solder joints 5 may be sufficient to cause a complete failure.

The crystal body 1 is carried by a highly flexible spring wire support system 6, 7, 8 and 9 and this wire support system, when subjected to sufficient shock, jar or other externally applied mechanical vibration, may permit the crystal body 1 to bump against its adjacent enclosing container 15, or other mechanical stop means, with resultant possible chipping or damage to the periphery of the crystal body 1 and also a resultant possible damage by cracking of the solder joints 5 referred to. To minimize such damage not only to the crystal plate 1 but also to the solder joints 5, the crystal plate 1 may be made of round or circular shape and hence free from corners, and also a crystal bumper in the form of a casing liner 18 composed of relatively soft or pliant insulating material may be utilized in cooperation with the crystal 1 and the flexible spring wire assembly 6 to 9.

The casing liner 18 functioning as a mechanical stop or bumper may be placed adjacent to but not normally in engagement or contact with the periphery of the crystal plate 1, or the enclosing container 15, thus providing an air gap spacing 19 between the liner 18 and the container cover 15 and thus using the air space 19 as an air-cushion bumper which while not interfering with the desired electrically induced vibrations of the crystal plate 1, prevents an excessive bodily displacement of the crystal plate 1, resulting from externally applied mechanical shock applied to the crystal unit assembly. The casing liner 18 comprising the stop or bumper means disposed adjacent the periphery of the crystal body 1 may be constructed of relatively soft or pliant material such as "nylon" or "Teflon" or other suitable plastic material which will not chip or damage the crystal body 1 when the latter is bumped into contact with the liner stop means 18. The liner 18 may be in the form of a molded one-piece liner, such as a molded one-piece "nylon" liner, which being free from butt joints avoids the possibility of detached free ends, due to warpage, that may eventually protrude and interfere with the crystal operation. As illustrated in the drawing, the one-piece liner 18 is formed with a slight taper inwardly starting from the open end thereof, to provide an air cushion 19 between the liner 18 and the container 15 and is held in position by pressure of the base 14 forcing the closed end of the liner 18 against the container 15. Alternatively, the liner 18 may be made in the form of a folded type of one-piece liner, such as a folded one-piece "Teflon" liner, insertable in spaced or in close fitting relation along the inner wall surfaces of the metal cover 15. As another alternative, the liner 18 for the metal casing 15 may consist for example of an integral coating of pliant or resilient insulating material such as "neoprene" artifical rubber which may conveniently be applied in liquid form to the internal wall surfaces of the casing 15.

The insulating liner 18 may function not only as a bumper or stop means, but also when spaced at a more or less critical distance from the adjacent edges of the crystal body 1, may function as a baffle or reflector for suppressing undersired acoustical resonance within the enclosing container 15. Also, the liner 18 may function as an electrical insulating means disposed between parts of the spring support wires 6 to 10 and the enclosing metallic container 15.

In accordance with a feature of this invention and as illustrated in the drawing, the crystal plate 1 may be made round or nearly round in shape, the peripheral edge being of curved form and hence free from corners. One of the advantages of the round shaped crystal plate 1 is that it has little or no tendency to twist the crystal plate 1 on its support wires 6 and 7 at the solder joints 5 which are bonded to the ends of the associated crystal support wires 6 and 7. Such twisting is a fault which is common with the earlier forms of wire mounted plate using a square faced crystal plate. During the impact resulting from mechanical shock, the crystal plate 1 may often hit the enclosing cover 15, or its associated liner stop means 18, with considerable force. In the case of the earlier square faced crystal plate, one corner thereof may hit first as the crystal plate rocks on its support wires 6 and 7 and when the force is sufficient, another corner thereof may also hit the side of the cover 15. The result is to produce a twist or torsion in the adjacent support wires 6 and 7 sufficient in some cases, or if repeated often enough, to twist the support wire 6 or 7 out of the associated solder joint 5, or to crack the solder joint 5. This difficulty may be overcome by using, as illustrated in the drawing, the round shaped form of crystal plate 1 which, having a curved shape periphery free from corners, has little tendency to produce torsion in the support wires 6 and 7 when the crystal plate 1 is bumped against its associated stop means 18.

Another advantage of the round shaped crystal plate 1 illustrated in the drawing, is that, when so bumped against its associated stop means 18, little or no chipping damage results thereto. Since on the periphery of the round faced crystal plate 1, there are no corners, the round faced crystal plate 1 is comparatively free from the chipping damage that is common to the earlier square faced crystal plate.

Also, the round shaped crystal plate 1 provided in accordance with this invention, may result in a considerable reduction in the cost of manufacture by eliminating several of the process steps formerly required in the manufacture of the earlier square shaped crystal plate. In the cutting operation, the linear major face edges of the earlier square faced CT or DT cut quartz crystal plate are aligned and cut to correspond to the mutually perpendicular X and Z′ axes of the quartz crystalline material, whereas in cutting the round faced form of crystal plate 1, such process steps of aligning the major face edges of the crystal plate are eliminated. Moreover, in the subsequent dimensioning of the round shaped plate 1 for frequency adjustment, only one critical dimension, namely the diameter, is involved for dimensioning the round faced crystal plate 1, whereas two critical dimensions, namely the mutually perpendicular length and width major face dimensions, are involved for dimensioning the earlier square faced crystal plate. In addition, time may be saved in mounting the round faced crystal plate 1 in its holder 14 since the round shaped crystal plate 1 may be mounted in any position on its axis, whereas the earlier square faced plate usually must be mounted with one edge parallel to the base 14 in order to minimize the effects of its corners hitting against the enclosing casing 15.

Accordingly, the crystal plate 1 may be made to have round or circular shaped major faces, as illustrated in the drawing, with a resultant longer life as well as a reduction in the cost of manufacture. Also, an advantage results in respect to the frequency constant obtained from the round faced crystal plate 1 as compared with that of the earlier square faced crystal plate. As an illustrative example, the frequency constant, which is the arithmetical product of the frequency and the frequency controlling dimension, is for a round faced CT cut (+38 degrees) face shear mode quartz crystal plate 1, approximately 3745 kilocycles per second per millimeter of its diameter dimension, as compared to approximately 3080 kilocycles per second per millimeter of the width or the length dimension of the earlier square faced quartz crystal plate of the same CT cut orientation. This means that for the same frequency, the round shaped crystal plate 1, in the same cut or orientation, will be larger in size and therefore somewhat easier to handle in the process of fabrication and moreover, being of larger mass, will be less affected in its operation by its associated wire mounting system which forms a component part of the composite vibratory system comprising the piezoelectric crystal 1 and its associated support spring wires 6 and 7 and solder joints 5.

The face shear mode crystal plate 1 may be adjusted to the desired frequency. This may be done by grinding the peripheral edges thereof with a suitable wet or dry abrasive, thereby reducing the value of the frequency-controlling diameter dimension while simultaneously raising the frequency. If the crystal plate 1 is to have favorable aging characteristics where its frequency is held to a close tolerance of about 0.01 per cent or better over a period of years, then the surface including the edges should be carefully prepared and maintained. It is accepted practice to etch crystal plates by a suitable solvent to minimize a change in frequency due to aging. Hence the edge grinding method of adjusting to final frequency when done after such etching, tends to adversely affect the aging characteristics by reintroducing loose quartz dust clinging to the surface, and also such edge grinding may chip or fracture the edge.

An alternative method of calibrating or adjusting the frequency of a wire mounted face-mode type of crystal plate 1 is to load the surface thereof with any suitable metallic or other material in order to lower the frequency. For this purpose, silver or other suitable metal may be electroplated over a base coating of evaporated silver or other suitable metal, making use of a suitable electroplating time and current intensity in the electroplating bath in order to lower the frequency of the electroplated crystal plate 1 to a desired frequency value. The electroplated silver coating on top of the base coat of evaporated silver preserves the operating characteristics quite satisfactorily but requires skill to judge the actual plating time, since time and current intensity will change with the size of the crystal plate 1 to be electroplated, and with other factors.

A more desirable method is to evaporate gold or other metal in vacuum upon the crystal plate 1 while it is being oscillated at its natural frequency, by means of a suitable evaporator (not shown), and a suitable shielding means (not shown) for the crystal plate. The shielding means may shield the crystal plate from the radiant heat of some 2000° F. supplied by the heated filament of the evaporator, and at the same time provide an even distribution of evaporated gold coating 2 and 3 over the entire opposite major faces of the crystal plate 1. The shield may be designed to allow a free path of gold to the crystal plate surface to be metallized, and to allow access to the heater filament for reloading with the metallic gold to be evaporated.

A first or rough adjustment mask having an opening of suitable size and shape to correspond to that of the major face of the crystal plate 1 may be used to allow the evaporated gold coating 2 and 3 to cover each of the entire major faces of the crystal plate 1 and to adjust the frequency to within about 0.01 per cent of the desired frequency. If closer tolerances are required, a second or fine adjustment mask may be used to adjust the frequency to closer values such as to values within ±0.003 per cent of the desired frequency for the metallized crystal plate 1. The second or fine adjustment mask referred to may be provided with small holes therein suitably spaced to allow the evaporated gold to collect only at spots 20 on the margin of one or both of the major faces of the crystal plate 1, while shielding the rest of the crystal plate 1 from the hot filament and minimizing the frequency shift therein due to heating. Crystal plates 1 finally adjusted to frequency by the use of the second mask referred to will retain their operating characteristics to a surprising degree. In the case of the earlier square faced crystal plate, the additional spots 20 of evaporated gold provided by the second mask referred to, may be symmetrically placed in the form of small circular spots at or near the four corners of one or both of the major faces of the square faced crystal plate; and in the case of the round faced crystal plate 1, the additional spots 20 of evaporated gold provided by the second mask referred to, may be symmetrically placed in balanced loading relation in the form of four small circular spots 20 at or near the peripheral margins and along two mutually perpendicular axes of one or both of the major faces of the crystal plate 1, as illustrated by the spots 20 as shown in Figs. 1 to 3.

The manufacturing procedure for the frequency adjustment of the crystal unit may be as follows: Before the initial frequency adjustment, the crystal unit assembly may be baked at about 215° F. for about 30 minutes in a ventilated oven, then cleaned by spraying with hot water at a temperature of about 180° F. minimum, and dried within about one minute thereafter by centrifugal force or by an air jet filtered to remove oil, excess water and other foreign matter. The frequency may then be adjusted to within about 0.01 per cent of the final frequency by depositing a gold film 2 and 3 on the major surfaces of the crystal plate 1 by the known evaporation in vacuum process. After the initial frequency adjustment referred to, the crystal unit assembly may be again baked at a temperature of about 215° F. for about 30 minutes in a ventilated oven, and then cooled to room temperature. This heat cycle may be repeated some three times to obtain good stabilization of the frequency characteristics of the crystal unit. The crystal may then be cleaned by spraying it with hot water at a temperature of about 180° F. minimum, and dried within about one minute thereafter as stated above. The crystal unit may then be adjusted to the final required frequency by depositing additional gold at spots 20 thereon by the known evaporation in vacuum process. The spots 20 of additional loading metal may if desired be placed at regions on the crystal plate 1 where they may function to reduce unwanted spurious resonances in the crystal plate 1, such regions being located by trial and experiment.

Reference is made to R. A. Sykes Patent 2,392,429 dated January 8, 1946, for information in respect to adjusting an oscillating crystal to frequency by the evaporation in vacuum process.

Although this invention has been described and illustrated in relation to specific arrangements, it is to be understood that it is capable of application in other organizations and is therefore not to be limited to the particular embodiments disclosed.

What is claimed is:

1. Piezoelectric crystal apparatus comprising an electroded piezoelectric crystal body, means including flexible spring supports fastened to said body for resiliently supporting said body, stop means normally spaced away from but disposed adjacent said body for limiting the bodily displacement of said body when said body is bumped against said stop means as a result of externally applied mechanical shock, said stop means comprising in combination with a casing for said body, a liner disposed in spaced air-cushioning relation with respect to the inner wall surface of said casing.

2. Piezoelectric crystal apparatus comprising an electroded piezoelectric crystal body, means including flexible spring supports fastened to said body for resiliently supporting said body, stop means normally spaced away from but disposed adjacent said body for limiting the bodily displacement of said body when said body is bumped against said stop means as a result of externally applied mechanical shock, said stop means comprising in combination with a casing for said body, a liner disposed in spaced air-cushioning relation with respect to the inner wall surface of said casing, said liner being an electrically insulating liner disposed between said casing and said spring supports.

3. Piezoelectric crystal apparatus comprising an electroded piezoelectric crystal body, means including flexible spring supports fastened to said body for resiliently supporting said body, stop means normally spaced away from but disposed adjacent said body for limiting the bodily displacement of said body when said body is bumped against said stop means as a result of externally applied mechanical shock, said stop means comprising in combintaion with a casing for said body, a liner disposed in spaced air-cushioning relation with respect to the inner wall surface of said casing, said liner being an electrically insulating liner disposed between said casing and said spring supports, said liner being a molded one-piece plastic type tapered liner insertable into said casing.

4. Piezoelectric crystal apparatus comprising a piezoelectric crystal element having substantially round shaped oppositely disposed major faces, said crystal element being adapted for face mode of motion at a frequency controlled mainly by the diameter of said round shaped major faces, the diameter of said major faces of said crystal element being made of a value corresponding to the value of said frequency, electrodes formed integral with said opposite major faces, and means comprising conductive flexible spring wires fastened by adhesive joints to said integral crystal electrodes at regions thereon adjacent the centers of said major faces for resiliently supporting said crystal element and establishing individual electrical connections with said crystal electrodes, the round shaped periphery of said resiliently supported crystal element constituting means for reducing bumping shock damage to said crystal element periphery and to said adhesive joints.

5. Piezoelectric crystal apparatus in accordance with claim 4, said crystal element comprising a piezoelectric quartz crystal element adapted for vibrational frequency having a substantially zero temperature coefficient, said major faces of said crystal element being disposed substantially parallel to an X axis and inclined at one of the angles of substantially +38 and −52 degrees with respect to the Z axis of said quartz, said angle being a value corresponding to said substantially zero temperature coefficient value for said frequency.

6. Piezoelectric crystal apparatus comprising a piezoelectric crystal plate having oppositely disposed major faces and a curved shaped periphery free from corners, electrodes formed integral with said oppositely disposed major faces, means comprising flexible spring wires fastened by adhesive joints to said integral electrodes for resiliently supporting said crystal plate, and stop means normally spaced away from but disposed adjacent said curve shaped periphery of said crystal plate, said curve shaped periphery constituting means for reducing torsion or twisting strain on said adhesive joints when said periphery of said crystal plate is bodily displaced from its normal operating position and bumped against said stop means as a result of mechanical shock applied to said crystal apparatus.

7. Piezoelectric crystal apparatus comprising a piezoelectric crystal plate having substantially round shaped oppositely disposed major faces, means comprising electrodes formed integral with said oppositely disposed major faces for operating said crystal plate in a face mode of motion at a frequency controlled mainly by the value of the diameter of said round shaped major faces, means comprising flexible spring wires fastened by adhesive joints to said integral electrodes at regions thereon adjacent the centers of said major faces for resiliently supporting and establishing individual electrical connections with said crystal plate, and stop means normally spaced away from but disposed adjacent the curve shaped periphery of said crystal plate, said curve shaped periphery constituting means for reducing torsion or twisting strain on said adhesive joints when said periphery of said crystal plate is bodily displaced from its normal operating position and bumped against said stop means as a result of mechanical shock applied to said crystal apparatus, said stop means comprising an enclosing cover for said crystal apparatus.

8. Piezoelectric crystal apparatus comprising a piezoelectric crystal plate having substantially round shaped oppositely disposed major faces, means comprising electrodes formed integral with said oppositely disposed major faces for operating said crystal plate in a face mode of motion at a frequency controlled mainly by the value of the diameter of said round shaped major faces, means comprising flexible spring wires fastened by adhesive joints to said integral electrodes at regions thereon adjacent the centers of said major faces for resiliently supporting and establishing individual electrical connections with said crystal plate, and stop means normally spaced away from but disposed adjacent the curve shaped periphery of said crystal plate, said curve shaped periphery constituting means for reducing torsion or twisting strain on said adhesive joints when said periphery of said crystal plate is bodily displaced from its normal operating position and bumped against said stop means as a result of mechanical shock applied to said crystal apparatus, said stop means comprising an enclosing cover for said crystal apparatus and an insulating liner composed of relatively soft or pliant material disposed in spaced air-cushioning relation with respect to the inner wall surface of said cover.

9. Piezo electric crystal apparatus comprising a piezo electric crystal plate having substantially round shaped oppositely disposed major faces, means comprising electrodes formed integral with said oppositely disposed major faces for operating said crystal plate in a face mode of motion at a frequency controlled mainly by the value of the diameter of said round shaped major faces, means comprising flexible spring wires fastened by adhesive joints to said integral electrodes at regions thereon disposed away from and inwardly of said periphery of said major faces for resiliently supporting and establishing individual electrical connections with said crystal plate, and stop means normally spaced away from but disposed adjacent the curve shaped periphery of said crystal plate, said curve shaped periphery constituting means for reducing torsion or twisting strain on said adhesive joints when said periphery of said crystal plate is bodily displaced from its normal operating position and bumped against said stop means as a result of mechanical shock applied to said crystal apparatus, said stop means comprising an enclosing cover for said crystal apparatus and an insulating liner composed of relatively soft or pliant material disposed in an enclosed air space relation with respect to the upper inner wall surface of said cover, said liner being a removable one-piece molded plastic liner.

10. Piezoelectric crystal apparatus comprising a piezoelectric crystal plate having substantially round shaped oppositely disposed major faces and having a curved shaped periphery free from corners, means comprising electrodes formed integral with said oppositely disposed major faces for operating said crystal plate in a face mode of motion at a frequency controlled mainly by the value of the diameter of said round shaped major faces, means comprising flexible spring wires fastened by adhesive joints to said integral electrodes at regions thereon adjacent the centers of said major faces for resiliently supporting and establishing individual electrical connections with said crystal plate, and stop means normally spaced away from but disposed adjacent said curve shaped periphery of said crystal plate, said curve shaped periphery constituting means for reducing torsion or twisting strain on said adhesive joints when said periphery of said crystal plate is bodily displaced from its normal operating position and bumped against said stop means as a result of mechanical shock applied to said crystal apparatus, said adhesive joints comprising solder.

11. Piezoelectric crystal apparatus comprising a piezoelectric crystal plate having oppositely disposed major faces and a curved shaped periphery free from corners, electrodes formed integral with said oppositely disposed major faces, means comprising flexible spring wires fastened by adhesive joints to said integral electrodes at regions thereon adjacent the centers of said major faces for resiliently supporting and establishing individual electrical connections with said crystal plate, and stop means normally spaced away from but disposed adjacent said curve shaped periphery of said crystal plate, said curve shaped periphery constituting means for reducing torsion or twisting strain on said adhesive joints when said periphery of said crystal plate is bodily displaced from its normal operating position and bumped against said stop means as a result of mechanical shock applied to said crystal apparatus, said adhesive joints comprising solder composed of an alloy of about 95.5 per cent tin, about 3.5 per cent silver, and about 1.0 per cent cadmium.

12. Piezoelectric crystal apparatus comprising a piezoelectric crystal plate having oppositely disposed round shaped major faces, said major faces having a diameter dimension related to the value of the frequency of said crystal plate, means comprising electrodes formed integral with said major faces for operating said crystal plate in a face type mode of motion at said frequency controlled mainly by the value of said major face dimension, means comprising added spots of evaporated metal loading material formed integral with and on top of at least one of said electrodes and disposed adjacent and in balanced loading arrangement symmetrically along the peripheral region of said electroded major faces for controlling the adjusted value of said frequency, and means comprising flexible spring wires fastened to said integral electrodes at regions located entirely away from the periphery and adjacent the node of motion of said crystal plate for resiliently supporting and establishing individual electrical connections with said crystal plate.

13. Piezoelectric crystal apparatus comprising a piezoelectric crystal plate having oppositely disposed round shaped major faces, said major faces having a diameter dimension related to the value of the frequency of said crystal plate, means comprising electrodes formed integral with said major faces for operating said crystal plate in a face type mode of motion at said frequency controlled mainly by the value of said major face dimension, means comprising added spots of evaporated metal loading material formed integral with and on top of at least one of said electrodes and disposed adjacent and along the peripheral region of said electroded major faces for controlling the adjusted value of said frequency, and means comprising flexible spring wires fastened to said integral electrodes at regions located entirely away from the periphery and adjacent the central node of motion of said crystal plate for resiliently supporting and establishing individual electrical connections with said crystal plate, said spots of added metal comprising at least one pair of spots, each pair of said spots being spaced substantially equal distances from the center and along an axis passing through said center of said crystal plate.

14. Piezoelectric crystal apparatus comprising a piezoelectric quartz crystal plate having oppositely disposed round shaped major faces, said major faces having a diameter dimension related to the value of the frequency of said crystal plate, means comprising gold electrodes formed integral with said major faces for operating said crystal plate in a face shear type mode of motion at said frequency controlled mainly by the value of said major face diameter dimension, means comprising added spots of evaporated gold metal loading material formed integral with and on top of at least one of said gold electrodes and disposed adjacent and along the peripheral region of said electroded major faces for controlling the adjusted value of said frequency, and means comprising flexible spring wires soldered to said integral electrodes at regions located entirely away from the periphery and adjacent the node of motion at the center of said crystal plate for resiliently supporting and establishing individual electrical connections with said crystal plate, said spots of added metal comprising two pairs of round shaped spots, each pair of said spots being spaced substantially equal distances from said center and along mutually perpendicular axes passing through said center of said crystal plate.

DAVID M. RUGGLES.

REFERENCES CITED

The following references are of record in the file of this patent:

UNITED STATES PATENTS

| Number | Name | Date |
|---|---|---|
| 1,848,630 | Julburt | Mar. 8, 1932 |
| 1,896,513 | Hovgaard | Feb. 7, 1933 |
| 2,095,376 | Bechmann | Oct. 12, 1937 |
| 2,371,613 | Fair | Mar. 20, 1945 |
| 2,441,139 | Fair | May 11, 1948 |